US009412686B2

(12) United States Patent
Lin et al.

(10) Patent No.: US 9,412,686 B2
(45) Date of Patent: Aug. 9, 2016

(54) INTERPOSER STRUCTURE AND MANUFACTURING METHOD THEREOF

(71) Applicant: UNITED MICROELECTRONICS CORP., Hsin-Chu (TW)

(72) Inventors: Ming-Tse Lin, Hsinchu (TW); Kuei-Sheng Wu, Miaoli County (TW); Chien-Li Kuo, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 65 days.

(21) Appl. No.: 14/468,329

(22) Filed: Aug. 26, 2014

(65) Prior Publication Data

US 2016/0064314 A1 Mar. 3, 2016

(51) Int. Cl.
| | |
|---|---|
| *H05K 1/09* | (2006.01) |
| *H01L 23/498* | (2006.01) |
| *H01L 21/48* | (2006.01) |
| *H01L 21/311* | (2006.01) |

(52) U.S. Cl.
CPC .... *H01L 23/49811* (2013.01); *H01L 21/31111* (2013.01); *H01L 21/4853* (2013.01); *H01L 21/4857* (2013.01); *H01L 23/49822* (2013.01); *H01L 23/49838* (2013.01); *H01L 23/49866* (2013.01)

(58) Field of Classification Search
CPC ............. H01K 1/02; H01K 1/03; H01K 1/11; H01K 1/18; H05K 3/00; H05K 3/34; H05K 3/40; H05K 3/46; H05K 3/485; H05K 3/52; H01L 21/44; H01L 21/48; H01L 21/60

USPC ......... 174/257, 250, 255, 258, 260–262, 267; 257/620, 673, 690, 737, 780; 228/245
See application file for complete search history.

(56) References Cited

U.S. PATENT DOCUMENTS

| | | | | |
|---|---|---|---|---|
| 6,329,609 | B1 * | 12/2001 | Kaja et al. ..................... | 174/262 |
| 8,241,963 | B2 * | 8/2012 | Shen et al. ..................... | 438/121 |
| 8,492,263 | B2 * | 7/2013 | Wang et al. .................... | 438/614 |
| 8,802,504 | B1 * | 8/2014 | Hou et al. ...................... | 438/125 |
| 2003/0051911 | A1 * | 3/2003 | Roeters et al. ................. | 174/267 |
| 2004/0007779 | A1 * | 1/2004 | Arbuthnot et al. ............. | 257/780 |
| 2008/0230879 | A1 * | 9/2008 | Sharma et al. ................. | 257/673 |
| 2008/0237829 | A1 * | 10/2008 | Cheah et al. ................... | 257/690 |
| 2009/0152741 | A1 * | 6/2009 | Chang et al. ................... | 257/778 |
| 2010/0230811 | A1 * | 9/2010 | Shin et al. ...................... | 257/737 |
| 2012/0006591 | A1 * | 1/2012 | Kaneko et al. ................ | 174/262 |
| 2012/0012997 | A1 * | 1/2012 | Shen et al. ..................... | 257/737 |
| 2012/0049343 | A1 * | 3/2012 | Schulze et al. ................ | 257/737 |
| 2013/0207239 | A1 * | 8/2013 | Yu et al. ......................... | 257/620 |

(Continued)

*Primary Examiner* — Xiaoliang Chen
(74) *Attorney, Agent, or Firm* — Winston Hsu; Scott Margo (57) ABSTRACT

The present disclosure relates to an interposer structure and a manufacturing method thereof. The interposer structure includes a first dielectric layer, a conductive pad, and a bump. The conductive pad is disposed in the first dielectric layer, wherein a top surface of the conductive pad is exposed from a first surface of the first dielectric layer, the conductive pad further includes a plurality of connection feet, and the connection feet protrude from a bottom surface of the conductive pad to a second surface of the first dielectric layer. The bump is disposed on the second surface of the first dielectric layer, and the bump directly contacts to the connection feet. Through the aforementioned interposer structure, it is sufficient to achieve the purpose of improving the electrical performance of the semiconductor device and avoiding the signal being loss through the TSV.

10 Claims, 6 Drawing Sheets

(56) References Cited

U.S. PATENT DOCUMENTS

| | | | |
|---|---|---|---|
| 2013/0237055 A1* | 9/2013 | Funaya et al. | 438/672 |
| 2013/0256871 A1* | 10/2013 | Topacio et al. | 257/737 |
| 2013/0284499 A1* | 10/2013 | Imafuji | 174/250 |
| 2014/0144690 A1* | 5/2014 | Pares | 174/261 |
| 2014/0146507 A1* | 5/2014 | Lee | 361/783 |
| 2014/0151874 A1* | 6/2014 | Obu et al. | 257/737 |
| 2014/0353025 A1* | 12/2014 | Jang et al. | 174/262 |
| 2015/0014027 A1* | 1/2015 | Kaneko et al. | 174/255 |
| 2015/0014846 A1* | 1/2015 | Lai et al. | 257/737 |
| 2015/0029689 A1* | 1/2015 | Imafuji et al. | 361/767 |

* cited by examiner

INTERPOSER STRUCTURE AND MANUFACTURING METHOD THEREOF

BACKGROUND OF THE INVENTION

1. Field of the Invention

The present invention relates to an interposer structure and a manufacturing method thereof, and more particular to an interposer structure without silicon substrate and through silicon via, and a manufacturing method thereof.

2. Description of the Prior Art

Interposers refer to an electrical interface disposed between connections and dies, for widening the pitch of a connection or rerouting a connection. Currently, the interposer and the through silicon via (TSV) are widely used in multi-chip module to integrate multiple integrated circuit devices on a silicon substrate. Generally, the TSV structure disposed in the interposer is used to interconnect dies, or die and substrate, thereby supporting the interposer formed thereon and maintaining a stably electrical connection of the components in each level. However, such TSV structure may also lead to defects, for example, the diameter and depth of the TSV usually cause to the degradation of the high speed signal performance. Therefore, the performance of the entire semiconductor device may be affected, accordingly.

Thus, it is desirable that the said defects can be avoided, to obtain more reliable semiconductor device.

SUMMARY OF THE INVENTION

The present invention provides an interposer structure and a manufacturing method thereof, wherein the interposer structure does not include any through silicon via, so as to improve the electrical performance of the semiconductor device, to simplify the manufacturing process and to avoid signals loss through the TSV.

To achieve the purpose described above, the present invention provides an interposer structure, including a first dielectric layer, a conductive pad, and a bump. The first dielectric layer includes a first surface and a second surface opposite to the first surface. The conductive pad is disposed in the first dielectric layer, wherein a top surface of the conductive pad is exposed from the first surface of the first dielectric layer, the conductive pad further includes a plurality of connection feet, and the connection feet protrude from a bottom surface of the conductive pad to the second surface of the first dielectric layer. The bump is disposed on the second surface of the first dielectric layer, and the bump directly contacts to the connection feet.

To achieve the purpose described above, the present invention provides a manufacturing method of an interposer structure including following steps. First of all, a first dielectric layer is formed on a substrate. Next, a conductive pad is formed in the first dielectric layer, wherein the conductive pad includes a plurality of connection feet which protrude from a bottom surface of the conductive pad and directly contact to the substrate. Then, the substrate is removed. Finally, a bump is formed on another surface of the first dielectric layer, wherein the bump directly contacts to the connection feet.

Through the present invention, the present invention provides the interposer structure and the manufacturing method thereof. The interposer structure does not include the silicon substrate and the TSV, such that it can achieve the purpose of avoiding the defects caused by TSV, such as the degradation of the high speed signal performance, and simplifying the manufacturing process. Additionally, the interpose structure of the present invention includes the conductive pad having a plurality of monolithic connection feet, with those connection feet being spaced from each other and exposed from the first dielectric layer to directly bond to the bump. Therefore, the conductive pad of the interposer structure according to the present invention can achieve preferable connection with the bump, so as to provide more reliable electric connection.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
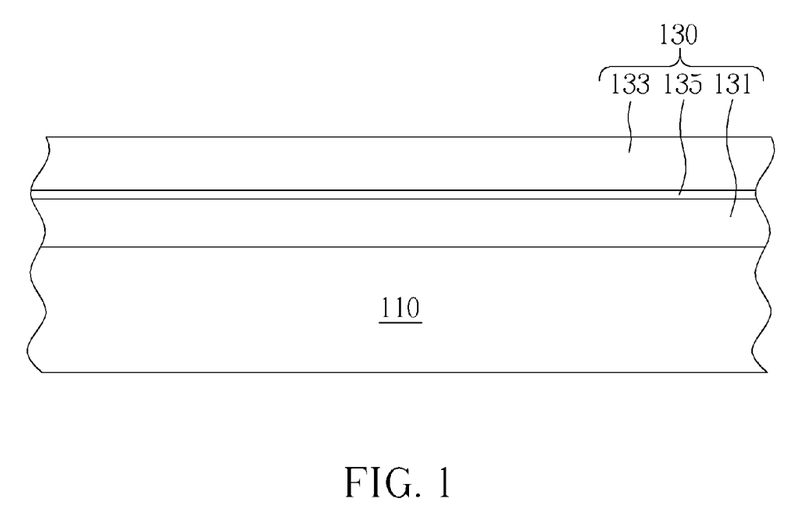
FIG. 1 to FIG. 9 is a schematic diagram illustrating a manufacturing method of an interposer structure according to a preferred embodiment of the present invention.

Referring to FIGS. 1-9, FIGS. 1-9 are schematic diagrams illustrating a manufacturing method of an interposer structure according to a preferred embodiment of the present invention. As shown in FIG. 1, a substrate 110 is firstly provided, and a first dielectric layer 130 is formed on the substrate 110. The first dielectric layer 130 may include a single layer structure or a multilayer structure. Preferably, the first dielectric layer 130 of the present embodiment is a multilayer structure, including three dielectric layers 131, 135, 133 stacked from bottom to top, wherein the dielectric layer 131 may be configured as an inter-layer dielectric (ILD) layer, and the dielectric layers 133, 135 may be configured as an inter-metal dielectric (IMD) layer. Further, the dielectric layer 135 is preferably disposed between the dielectric layers 131, 133, and includes a material having selectivity difference related to the dielectric layers 131, 133, such that the dielectric layer 135 may be perform like an etching stop layer in the following etching processes. For example, the dielectric layers 131, 133 may include silicon oxide, silicon nitride or silicon oxynitride, and the dielectric layer 135 may include silicon nitride, silicon carbon nitride or different material. However, the present invention is not limited thereto, and in another embodiment, the first dielectric layer 130 may also be a single layer structure or a multilayer structure having more than three dielectric layers being made of other materials.

Also, in one embodiment the first dielectric layer 130 can be formed on the substrate 110 through a chemical vapor deposition (CVD) process or a physical vapor deposition (PVD) process, for example, and the substrate 110 may include a semiconductor substrate including silicon, such as silicon substrate or silicon wafer, or other non-semiconductor materials, but not limited thereto.

Figure 2:
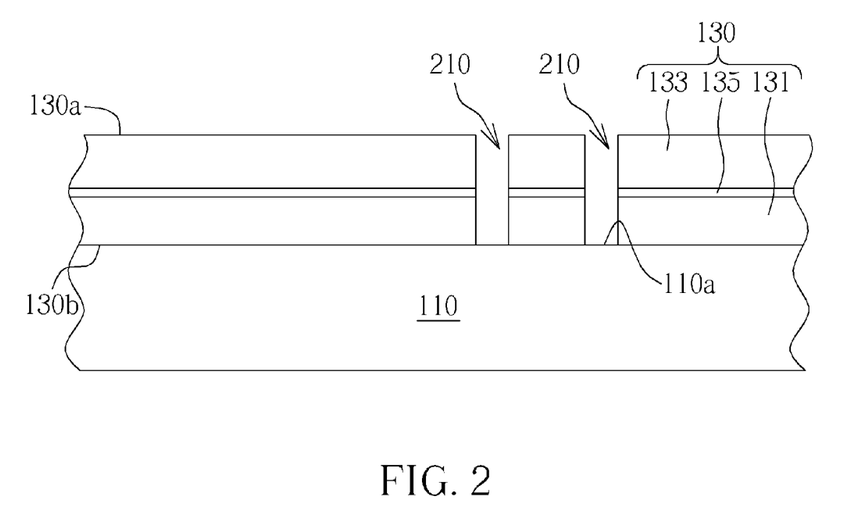

As shown in FIG. 2, the first dielectric layer 130 is patterned to form at least one first opening 210. The first dielectric layer 130 may be patterned through a method for example including performing a lithography process and an etching process to remove a portion of the dielectric layers 133, 135, 131, and to form the first opening 210. In other words, the first opening 210 penetrates two surfaces of the first dielectric layer 130, such as a first surface 130a and the second surface 130b opposite to the first surface 130a, and a portion of the top surface 110a of the substrate 110 is exposed from the first opening 210.

Figure 3:
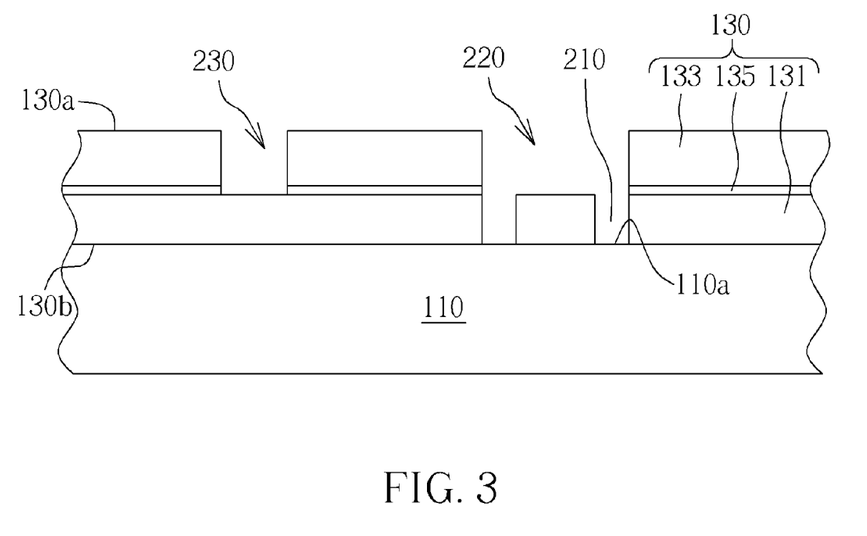

Next, as shown in FIG. 3, the first dielectric layer 130 is further patterned to form a second opening 220 and a third opening 230, wherein the second opening 220 is formed in alignment with the first opening 210. The first dielectric layer 130 may be further patterned for example by using the dielectric layer 135 as an etching stop layer, to firstly remove a portion of the dielectric layer 133 and to further remove a portion of the dielectric layer 135, so as to form the second opening 220 and the third opening 230 simultaneously, but not limited thereto. In another embodiment, the first dielectric layer 130 can also be further patterned by directly controlling the time during the etching process. It is note that, the second opening 220 and the third opening 230 only penetrate the dielectric layers 133, 135, such that portions of the dielectric layer 131 are exposed from the second opening 220 and the third opening 230 respectively. In addition, the second opening 220 has a greater diameter than the first opening 210, and partially overlaps the first opening 210 in a vertical direction.

Figure 4:
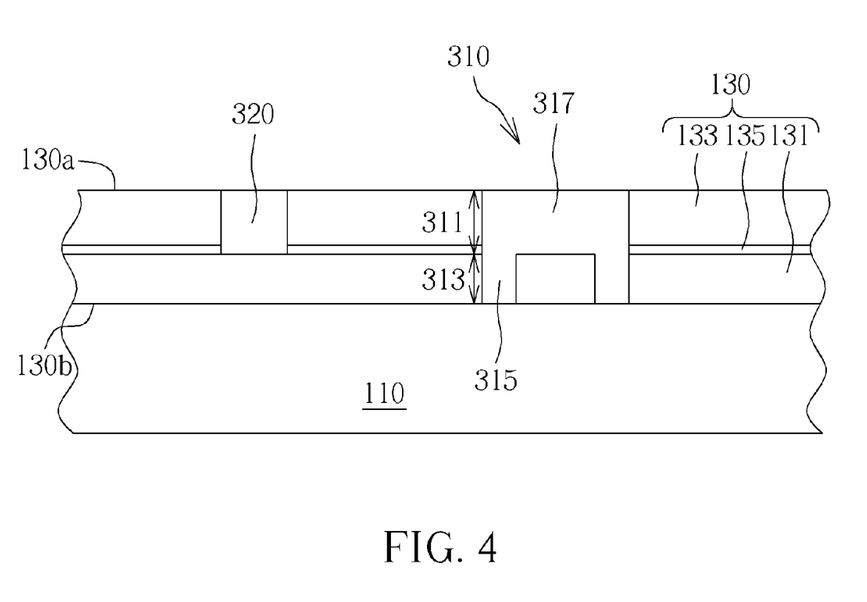

Then, as shown in FIG. 4, a conductive pad 310 positioned in the second opening 220 and first opening 210 and a metal structure 320 positioned in the third opening 230 are formed in the first dielectric layer 130 respectively. In the present embodiment, the conductive pad 310 and the metal structure 320 may be formed by following steps. Firstly, a barrier material layer (not shown in the drawings) and a seeding material layer (not shown in the drawings) are deposited on the first surface 130a of the first dielectric layer 130 sequentially, through a CVD process or PVD process, for example, wherein the barrier material layer and the seeding material layer cover the third opening 230, the second opening 220, the first opening 210, and the portions of the dielectric layer 131 and the portion of the substrate 110 exposed from the three openings 210, 220, 230, respectively. Then, a conductive material layer (not shown in the drawings), including tungsten (W), aluminum (Al), copper (Cu) or other conductive materials, is then deposited for example through an electroplating process, to fill the three openings 210, 220, 230. After that, a planarization process, for example a chemical mechanical polishing (CMP) process can be performed to remove the conductive material layer, the seeding material layer, and the barrier material layer outside the three openings 210, 220, 230, and to expose the first surface 130a of the first dielectric layer 130 and to form the conductive pad 310 and the metal structure 320 with a top surface thereof being exposed from the first surface 130a of the first dielectric layer 130.

That is to say that, the conductive material layer filled in the first opening 210, the second opening 220 and the third opening 230 form a conductive layer 317 being surrounded by a seed layer (formed from the aforementioned seed material layer, not shown in the drawings) and a barrier layer (formed from the aforementioned barrier material layer, not shown in the drawings), and the conductive layer 317, the seed layer and the barrier layer compose the conductive pad 310 and the metal structure 320 of the present embodiment, respectively. Also, it is also note that the conductive material layer filled in the first opening 210 forms a bottom portion 313 of the conductive pad 310, the conductive material layer filled in the second opening 220 forms a top portion 311 of the conductive pad 310, and the bottom portion 313 and the top portion 311 are monolithic. The barrier layer of the present embodiment may include a multilayer structure being made of titanium (Ti), tantalum (Ta), tantalum nitride (TaN), titanium nitride (TiN) or other suitable materials, but not limited thereto.

It is worth mentioning that, the metal structure 320 is entirely positioned in the dielectric layers 133, 135; and the top portion 311 of the conductive pad 310 is positioned in the dielectric layers 133, 135, and the bottom portion 313 of the conductive pad 310 is only positioned in the dielectric layer 131. Precise speaking, the bottom portion 313 includes a plurality of monolithic connection feet 315 spaced from each other and protruding from a bottom surface of the conductive pad 310 to the second surface 130b of the first dielectric layer 130, namely the connection feet 315 extending from the dielectric layer 135 toward the top surface 110a of the substrate 110. Thus, the conductive pad 310 can directly contact the substrate 110 through those connection feet 315.

Figure 5:
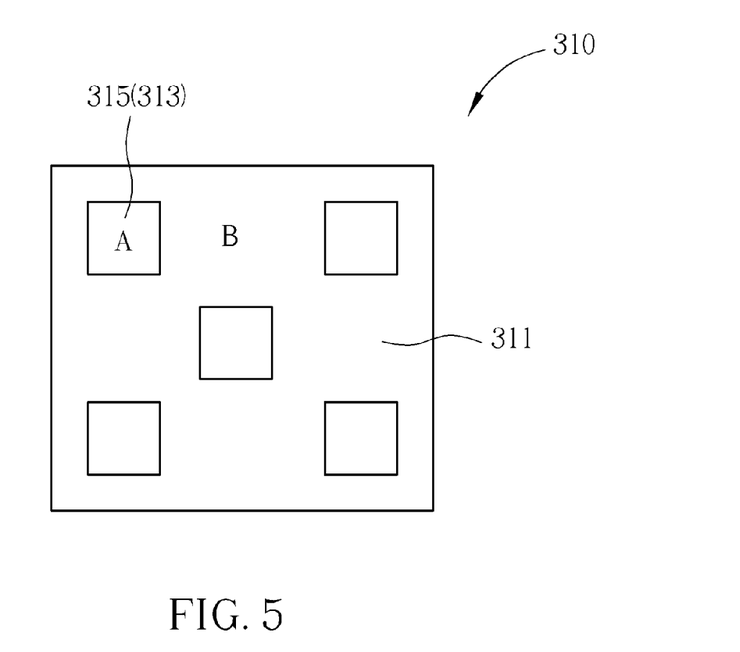
Figure 6:
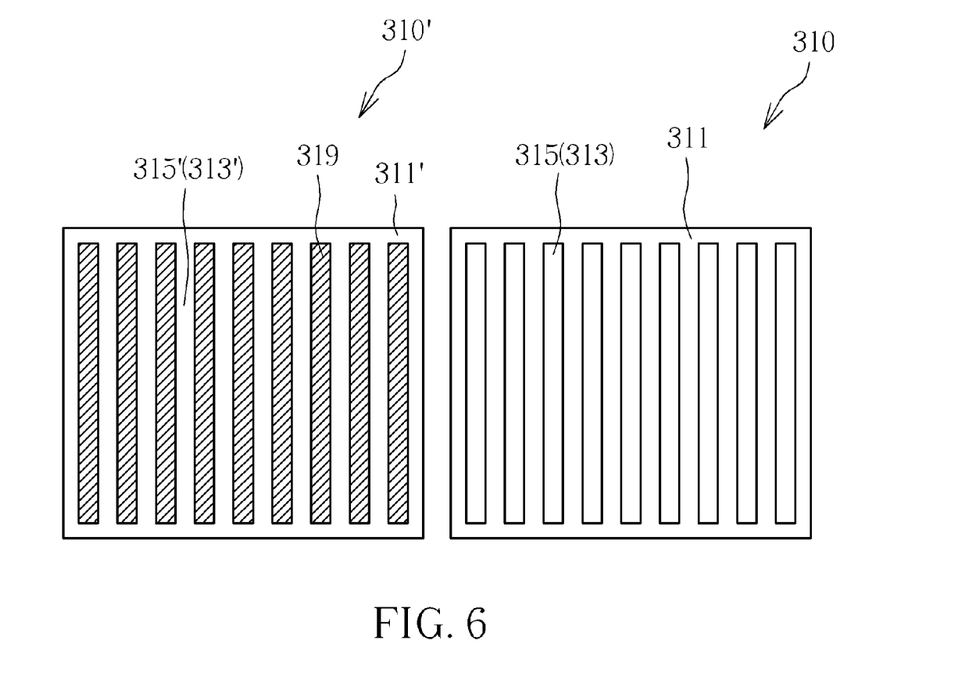

Referring to FIGS. 5 and 6, FIG. 5 is a schematic bottom view of the conductive pad shown in FIG. 4; and FIG. 6 is a schematic bottom view illustrating the conductive pad according to a variant type of the preferable embodiment of the present invention. As shown in FIG. 5, the connection feet 315 of the present embodiment are spaced from each other, with each of the connection feet 315 includes a pin-like shape and has an projection area A in a projection direction, wherein the area A is substantially between 20% and 99%, preferably between 20% and 50%, of an projection area B of the entire conductive pad 310 in the projection direction. With such arrangement, the conductive pad 310 is sufficient to achieve a stably connection with a bump in the following step. Please note that, the number and the shape of the connection feet 315 is not limited to the illustration shown in FIG. 5, and the connection feet 315 can also include a stripe-like shape as shown in FIG. 6. In another embodiment, the connection feet 315' can also be not spaced from each other but electrically connected with each other, with a plurality of slots 319 spaced from each formed in the connection feet 315', as shown in FIG. 6, but not limited thereto.

Figure 7:
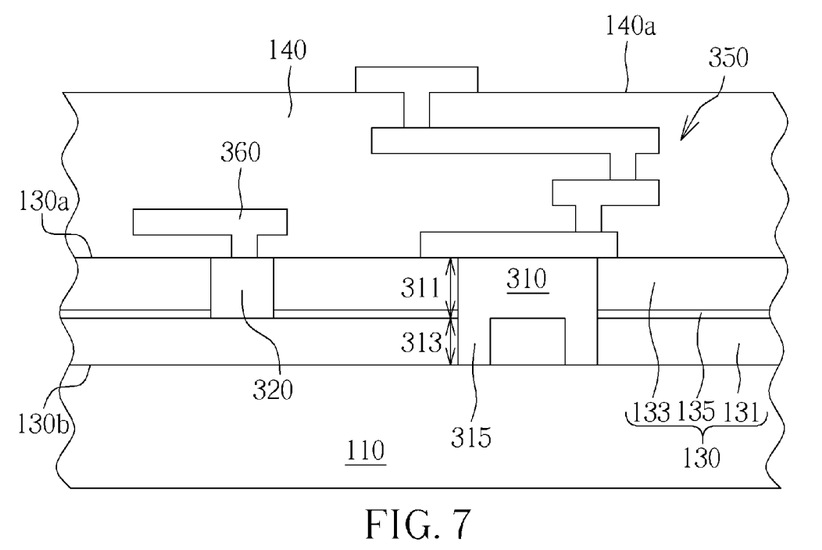

In the follow, as shown in FIG. 7, a second dielectric layer 140 and an interconnection system 350 are formed on the first dielectric layer 130. Precise speaking, the second dielectric layer 140 can be a single layer or multilayer structure disposed on the first surface 130a of the first dielectric layer 130 and the interconnection system 350 is distributed in the second dielectric layer 140 and is electrically connected to the conductive pad 310 in the first dielectric layer 130. In another embodiment of the present invention, a metal wiring (not showing in the drawing) is also formed in the second dielectric layer and the metal wiring includes another metal structure 360, wherein the metal structure 320 in the first dielectric layer 130 may be electrically connected to the metal structure 360 optionally to compose a re-distribution layer (RDL) or a part or a whole of an integrated passive device (IPD), such as a resistor, a capacitor, an inductor or an antenna, but not limited thereto. The metal structure 320 itself can also compose a part or a whole of RDL or IPD in another embodiment, however.

Figure 8:
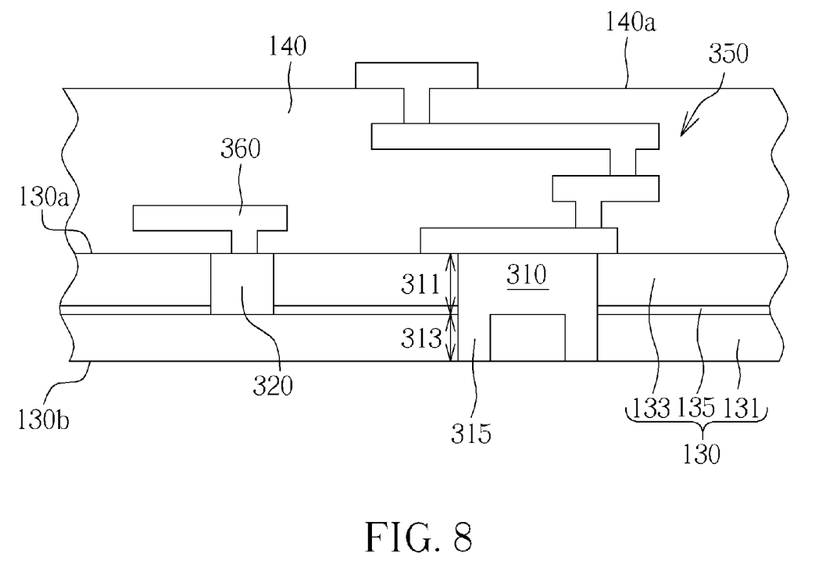

As shown in FIG. 8, the substrate 110 is removed until the second surface 130b of the first dielectric layer 130 is exposed. The substrate 110 is removed through a method for example including firstly attaching a carrying substrate (not shown in the drawings) to a top surface 140a of the second dielectric layer 140, and removing the substrate 110 by using the selectivity difference between the substrate 110 (silicon) and the first dielectric layer 130, through a polishing process and/or an etching process, such as wet etching process. After that, the carrying substrate is then removed in the following step, after the bump is bond to the first dielectric layer 130. However, the present invention is not limited to the aforementioned process.

Figure 9:
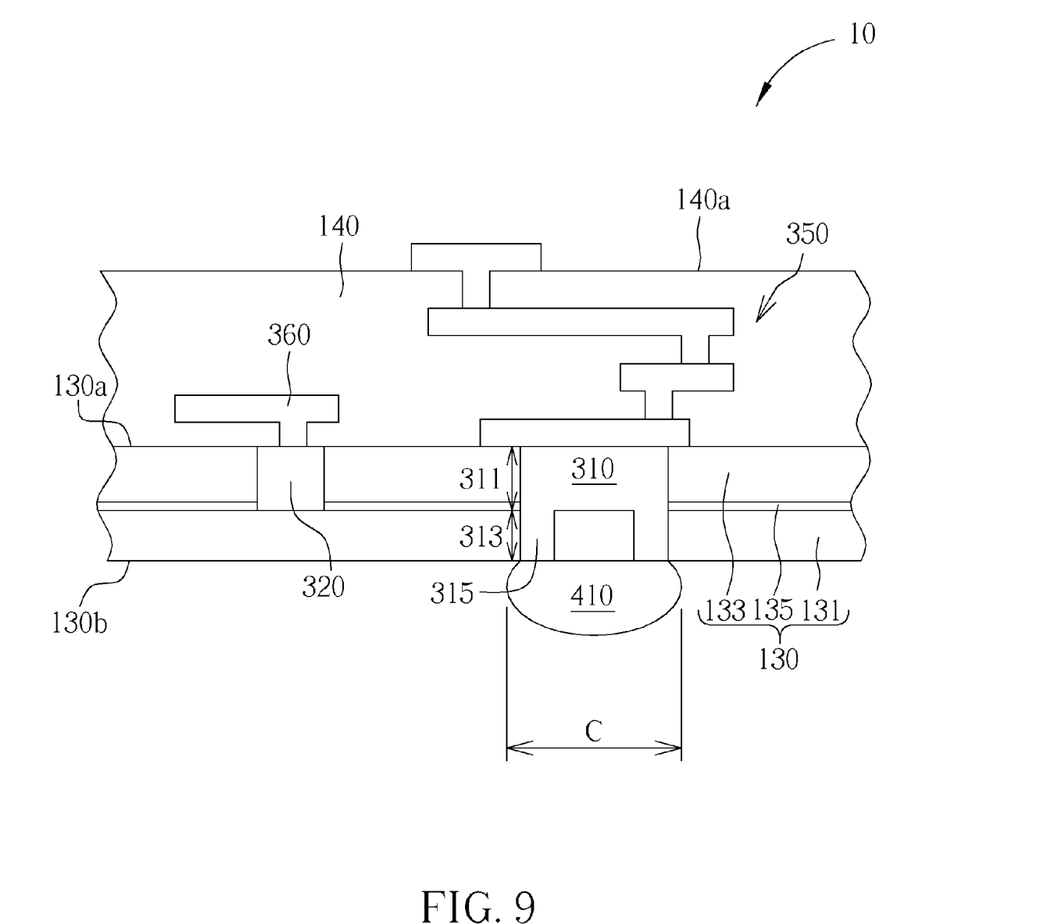

As shown in FIG. 9, a bump 410 is formed on the second surface 130b of the first dielectric layer 130, and thus, the interposer structure 10, according to the present embodiment is formed. The bump 410 is directly bonded to the conductive pad 310, and the bump 410 may be a solder ball or a conductor in any possible shape, but not limited thereto. It is noted that the bump 410 is substantially between 100 μm and 200 μm, for example, and has a projection area C, and the total projection area of the connection feet 315 is substantially between 20% and 95% of the projection area C. With such arrangement, the conductive pad 310 of the present invention is sufficient to achieve a stably connection with the bump 410, so as to perform a reliable electric connection therebetween.

Thus, through the aforementioned steps, the interposer structure according to the preferred embodiment of the present invention can be obtained, as being illustrated in FIG. 9. The interposer structure according to the preferred embodiment of the present invention is substantially consisted of the dielectric layer, and does not include the silicon substrate and the TSV, such that the interposer structure of the present invention can achieve the purpose of avoiding the defects caused by TSV, such as the degradation of the high speed signal performance, and simplifying the manufacturing process.

Further in view of FIG. 9, the interposer structure 10 according to the preferred embodiment of the present invention includes the first dielectric layer 130, the conductive pad 310, and the bump 410. The first dielectric layer 130 includes the two opposite surfaces, first and second surfaces 130a, 130b. The conductive pad 310 is disposed in the first dielectric layer 130, wherein the top surface of the conductive pad 310 is exposed from the first surface 130a of the first dielectric layer 130. The conductive pad 310 further includes the plurality of connection feet 315 protruding from the bottom surface of the conductive pad 310 to the second surface 130b of the first dielectric layer 130. It is noted that the connection feet 315 and the conductive pad 310 are monolithic. The bump 410 is disposed on the second surface 130b of the first dielectric layer 130, and the bump 410 directly contacts to the conductive pad 310 via those connection feet 315.

Precise speaking, each of the connection feet 315 is spaced from each other and comprises a pin-like shape illustrated in FIG. 4 and FIG. 5 or stripe-like shape shown in FIG. 6. Also, the projection area A of each of the connection feet 315 is substantially between 20% and 99% of the projection area B of the entire conductive pad 310, illustrated in FIG. 5, and the total projection area of the connection feet 315 is substantially between 20% and 95% of the projection area C of the bump 410.

Also, the interposer structure 10 further includes the second dielectric layer 140 disposed on the first surface 130a of the first dielectric layer 130, and the interconnection system, 350 is disposed in the second dielectric layer 140 and directly contacts to the top surface of the conductive pad 310. Wherein, the first dielectric layer 130 may include a multilayer structure including the three dielectric layers 131, 133, 135, and the top portion 311 of the conductive pad 310 is disposed in the dielectric layers 133, 135 with the plurality of connection feet 315 protruding from the dielectric layer 135 and penetrating through the dielectric layer 131.

However, the interposer structure of the present invention is not limited to the aforementioned description, and which includes another variant type. The following description will detail other variant types of the interposer structure according to the preferred embodiment of the present invention. To simplify the description, the following description will detail the dissimilarities among those variant embodiments and the identical features will not be redundantly described. In order to compare the differences between the embodiments easily, the identical components in each of the following embodiments are marked with identical symbols.

Figure 10:
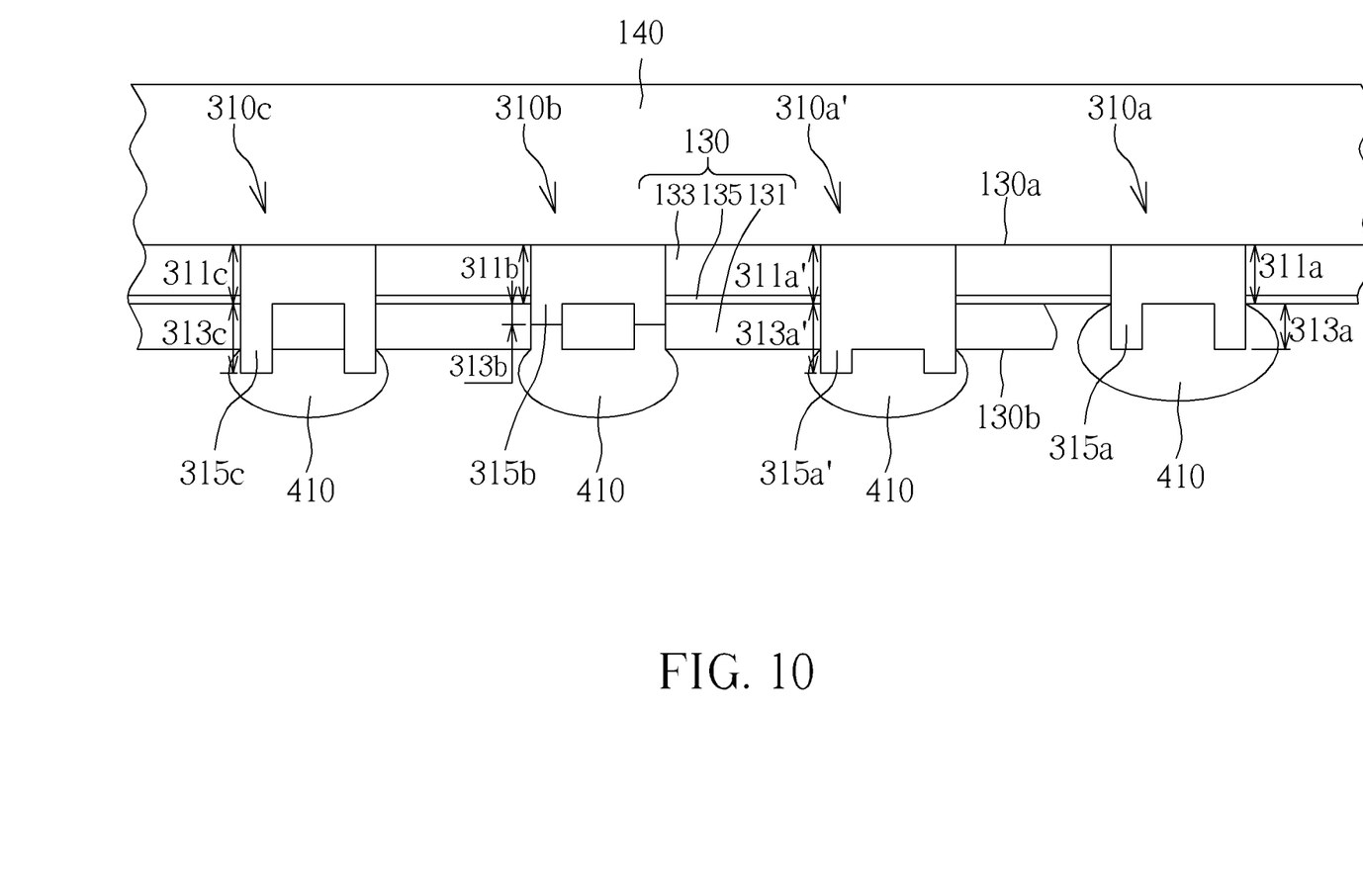
FIG. 10 is a schematic diagram illustrating variant types of interposer structure according to the preferred embodiment of the present invention.

Referring to FIG. 10, FIG. 10 is a schematic diagram illustrating variant types of interposer structure according to the preferred embodiment of the present invention. As shown in FIG. 10, the variant types of interposer structure include at least one of conductive pads 310a, 310a', 310b, 310c. In comparison with the aforementioned conductive pads 310, the dielectric layer 131 is removed, and the top portion 311a of the conductive pad 310a is positioned in the dielectric layers 135, 133, with the connection feet 315a (bottom portion 313a) protruding outward from the dielectric layer 135, 133 and bonding to the bump 410. In contrast, the top portion 311a' of the conductive pad 310a' is positioned in the dielectric layers 135, 133, 131, with the connection feet 315a' (bottom portion 313a') protruding outward from the second surface 130b of the first dielectric layer 130 and bonding to the bump 410. With such arrangement, the whole of the connection feet 315a, 315a' will directly contact to the bump 410, thereby significantly strengthen the bonding strength between the conductive pads 310a, 310a' and the bump 410.

Further in view of FIG. 10, the connection feet 315b (bottom portion 313b) of the conductive pad 310b do not extend to the second surface 130b of the first dielectric layer 130, such that the connection feet 315b is shorter, in comparison with the aforementioned connection feet 315. Thus, a portion of the bump 410 will fill in the first opening to contact to the connection feet 315b, thereby providing an improved bonding strength between the conductive pad 310a and the bump 410. In contrast, the connection feet 315c (bottom portion 313c) of the conductive pad 310c extends over the second surface 130b of the first dielectric layer 130, such that the connection feet 315c is longer, in comparison with the aforementioned connection feet 315. Thus, a portion of the connection feet 315c will stretch into the bump 410, thereby further strengthening the bonding strength between the conductive pad 310a and the bump 410. Except of the aforementioned difference, the top portions 311b, 311c of the conductive pads 310b, 310c are similar to what is mentioned above and will not be redundantly described herein.

In summary, the interposer structure according of the present invention includes the conductive pad having a plurality of monolithic connection feet, with those connection feet being spaced from each other and exposed from the first dielectric layer to directly bond to the bump. Therefore, the conductive pad of the interposer structure according to the preferred embodiment of the present invention can achieve preferable connection with the bump, so as to provide more reliable electric connection therebetween.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An interposer structure, comprising:
   a first dielectric layer, comprising a first surface and a second surface opposite to the first surface, wherein the first dielectric layer comprises a multilayer structure comprising a third dielectric layer and a fourth dielectric layer on the third dielectric layer;

a conductive pad disposed in the first dielectric layer, wherein a portion of the conductive pad is disposed in the fourth dielectric layer, a top surface of the portion of the conductive pad is exposed from the first surface of the first dielectric layer, the conductive pad further comprises a plurality of connection feet, and the connection feet protrude from a bottom surface of the portion of the conductive pad to the second surface of the first dielectric layer, wherein the conductive pad and the connection feet are monolithic and the connection feet protrude from the fourth dielectric layer and penetrates through the third dielectric layer;

a bump, disposed on the second surface of the first dielectric layer, the bump directly contacting to the connection feet.

2. The interposer structure according to claim 1, wherein each of the connection feet is spaced from each other and comprises a pin-like shape or a stripe-like shape.

3. The interposer structure according to claim 1, wherein there is a plurality of slots spaced from each in the connection feet.

4. The interposer structure according to claim 1, wherein an area of each of the connection feet is substantially between 20% and 99% of an area of the conductive pad.

5. The interposer structure according to claim 1, wherein a total area of the connection feet is substantially between 20% and 95% of an area of the bump.

6. The interposer structure according to claim 1, further comprising a second dielectric layer and an interconnection system, wherein the second dielectric layer is disposed on the first surface of the first dielectric layer, and the interconnection system is disposed in the second dielectric layer and directly contacts to the top surface of the conductive pad.

7. The interposer structure according to claim 1, wherein the first dielectric layer further comprises an etching stop layer disposed between the third dielectric layer and the fourth dielectric layer.

8. The interposer structure according to claim 1, wherein the interposer structure further comprises a metal structure disposed in the fourth dielectric layer of the multilayer structure, and the metal structure comprises a RDL or a passive device.

9. The interposer structure according to claim 1, wherein the interposer structure further comprises a metal structure disposed in the first dielectric layer and having a top surface exposed from the first surface of the first dielectric layer, and the metal structure comprises a RDL or a passive device.

10. The interposer structure according to claim 1, wherein the conductive pad comprises copper, tungsten or aluminum.

* * * * *